United States Patent [19]
Ono

[11] Patent Number: 5,898,616
[45] Date of Patent: Apr. 27, 1999

[54] SEMICONDUCTOR NONVOLATILE MEMORY AND SOURCE CIRCUIT FOR THIS MEMORY

[75] Inventor: Takashi Ono, Tokyo, Japan

[73] Assignee: Oki Electric Industry Co., Ltd., Tokyo, Japan

[21] Appl. No.: 08/970,500

[22] Filed: Nov. 14, 1997

[30] Foreign Application Priority Data

May 8, 1997 [JP] Japan ...................................... 9-134385

[51] Int. Cl.$^6$ ....................................................... G11C 7/00
[52] U.S. Cl. .............................. 365/185.17; 365/185.11; 365/185.13
[58] Field of Search .......................... 365/185.17, 185.11, 365/185.13, 230.03, 63

[56] References Cited

U.S. PATENT DOCUMENTS

| | | |
|---|---|---|
| 4,999,812 | 3/1991 | Amin . |
| 5,185,718 | 2/1993 | Rinerson et al. .................... 365/185.18 |
| 5,682,350 | 10/1997 | Lee et al. ............................. 365/185.13 |

FOREIGN PATENT DOCUMENTS

| | | |
|---|---|---|
| 56-94585 | 7/1981 | Japan . |
| 08036890 | 2/1996 | Japan . |

OTHER PUBLICATIONS

A 3.3 V Only 16mb DINOR Flash Memory; S. Kobayashi, et al.; ULSI Laboratory, Mitsubishi Electric Corporation; 1995; pp. 55–62.

"Memory Array Architecture and Decoding Scheme for 3 V Only Sector Erasable DINOR Flash Memory"; Kobayashi, et al.; IEEE Journal of Solid–State Circuits, vol. 29, No. 4; Apr., 1994; pp. 454–460.

*Primary Examiner*—Vu A. Le
*Attorney, Agent, or Firm*—Venable; Robert J. Frank

[57] ABSTRACT

In order to prevent sub bit line disturbance without leading to an increase in the current required for the write inducing new disturbance-related problems, the semiconductor nonvolatile memory according to the present invention comprises sub bit lines mutually connected in parallel with the drain(s) of the memory cells connected with a plurality of word lines for grouping the memory cells in units of a plurality of word lines, sub bit line selection transistors that connects the sub bit line to the bit line in a manner such that connection thereof can be interrupted, a sub source line connected to the source of the memory cells in a block grouped by the bit lines, and a block selection transistor that connects the sub source line to the source line interruptably. Prior to a write of data into at least an individual memory cell, the sub bit line selection transistors and the block selection transistor involved with one group interlock with each other in order to connect only the sub bit lines and the sub source line corresponding to the selected group to the bit lines and the source line respectively.

4 Claims, 17 Drawing Sheets

[PRIOR ART]

FIG.6

| | Selected Word Line WL | Unselected Word Line WL | Selected Main Bit Line MBL | Selected Sub Bit Line SBL | Unselected Sub Bit Line SBL | Selected Block Selection Line BSL | Unselected Block Selection Line BSL | Selected Sub Source Line SSL | Unselected Sub Source Line SSL |
|---|---|---|---|---|---|---|---|---|---|
| Voltage for a Write | -8 | 3 | 5 | 5 | F | 8 | 0 | 1 | F |

( F Indicates a Floating State )

FIG.8

| | Selected Word Line WL | Unselected Word Line WL | Selected Main Bit Line MBL | Selected Sub Bit Line SBL | Unselected Sub Bit Line SBL | Selected Block Selection Line BSL | Unselected Block Selection Line BSL | Selected Sub Source Line SSL | Unselected Sub Source Line SSL |
|---|---|---|---|---|---|---|---|---|---|
| Voltage for a Delete | 10 | 0 or F | −10 | −10 | F | 0 | −10 | −10 | F |

( F Indicates a Floating State )

FIG. 9

| | Selected Word Line WL | Unselected Word Line WL | Selected Main Bit Line MBL | Selected Sub Bit Line SBL | Unselected Sub Bit Line SBL | Selected Block Selection Line BSL | Unselected Block Selection Line BSL | Selected Sub Source Line SSL | Unselected Sub Source Line SSL |
|---|---|---|---|---|---|---|---|---|---|
| Voltage for a Delete | 10 | -5 | -10 | -10 | F | 0 or -5 | -10 | -10 | F |

(F Indicates a Floating State)

FIG.12

| | Selected WL for Write | Unselected WL for Write | Selected WL for Delete/ Read Out | Unselected WL for Delete/ Read Out |
|---|---|---|---|---|
| C | L | H | H | L |

FIG.13

| WL | Selected WL for Write | Unselected WL for Write | Selected WL for Delete | Unselected WL for Delete | Selected WL for Read Out | Unselected WL for Read Out |
|---|---|---|---|---|---|---|
| V31 | 3 | 3 | 10 | 10 | 3 | 3 |
| V32 | −8 | −8 | −5 | −5 | 0 | 0 |
| V21 | 3 | 3 | 10 | 10 | 3 | 3 |
| V22 | 0 | 0 | 0 | 0 | 0 | 0 |
| V11 | 0 | 0 | 0 | 0 | 3 | 3 |
| V12 | −8 | −8 | −5 | −5 | 0 | 0 |
| WL | −8 | 3 | 10 | −5 | 3 | 0 |

FIG. 15

| | Selected WL for Write | Unselected WL for Write | Selected WL for Delete/Read Out | Unselected WL for Delete/Read Out |
|---|---|---|---|---|
| Level Shifter Input Program-B | L | L | H | H |
| Level Shifter Input Decoder Signal | L | H | L | H |
| A | H | L | H | L |
| B | L | L | H | H |
| C | L | H | H | L |

FIG.17

| | Selected WL for Write | Unselected WL for Write | Selected WL for Delete | Unselected WL for Delete | Selected WL for Read Out | Unselected WL for Read Out |
|---|---|---|---|---|---|---|
| V31 | 3 | 3 | 10 | 10 | 3 | 3 |
| V32 | -8 | -8 | -5 | -5 | 0 | 0 |
| V21 | 3 | 3 | 10 | 10 | 3 | 3 |
| V22 | 0 | 0 | 5 | 5 | 0 | 0 |
| V11 | -3 | -3 | 0 | 0 | 3 | 3 |
| V12 | -8 | -8 | -5 | -5 | 0 | 0 |
| C21,C22 | 0 | 3 | 10 | 5 | 3 | 0 |
| C11,C12 | -8 | -3 | 0 | -5 | 3 | 0 |
| WL | -8 | 3 | 10 | -5 | 3 | 0 |

SEMICONDUCTOR NONVOLATILE MEMORY AND SOURCE CIRCUIT FOR THIS MEMORY

BACKGROUND OF THE INVENTION

The present invention relates to a nonvolatile memory in which overwrite is possible and a bipolar source circuit that can be ideally employed for memory overwrite.

While electrical batch deletion is possible in flash memory, it is necessary to batch delete data prior to a write even when the data are to be only partially overwritten, which, in turn, necessitates a full write operation for all the data.

In order to eliminate this inconvenience, the technology whereby memory cells are divided into blocks so that deletion by the block is made possible has been disclosed in "IEEE Journal of Solid State Circuits" Volume 29, Fourth Issue, April 1994, pages 454–459 (reference 1), in the technical report of IBICE. ICD 95~38 (1995~05) and in the Institute of Electronics, Information and Communication Engineers, Nos. 55~62 (reference 2).

While a nonvolatile memory which, as disclosed in references 1 and 2, is provided with a floating gate and writes and deletes data by employing an FN tunnel current and requires a high voltage for the FN tunnel, it requires only a small current. Therefore, internal voltages can be generated through an on-chip step-up circuit, achieving an advantage in that a flash memory, which enables an external single source voltage operation, can be easily manufactured.

However, since the FN tunnel phenomenon essentially takes place between two electrodes, when a memory cell array is constituted by taking advantage of this phenomenon, a problem of fluctuation in the threshold values (Vth) of unselected cells connected to a selected bit line, a selected word line or a selected P-well, i.e., disturbances in the threshold values, arises.

According to references 1 and 2, by setting the selected P_well at −8V and setting all the selected word lines within a block at 10V, electrons are caused to be injected from the channels of the selected cells, i.e., all the cells connected to all the word lines within the selected block in this case, into the floating gate so that a data delete operation can be performed in units of blocks, as illustrated in FIG. 2(a). A voltage of −4V is applied from a common source and the channel potential is raised to −4V to ensure that the cells in an unselected block within a P-well are not disturbed by the −8V voltage in the same P-well, thereby preventing a P-well disturbance (see FIG. 2(b)).

In order to write data, as shown in FIG. 3(a), −8V is applied to the selected word lines, the block selection Tr (SG in the reference) is turned on at 8V, and 5V is applied to the drain of the selected cell by the main bit line (MBL) and electrons are drawn out from the floating gate. By setting the main bit lines of the cells from which no electrons are to be drawn out to 0V, it is possible to selectively write "1" and "0" in the data (see FIG. 3(b)).

In contrast, unselected blocks are protected from disturbance by turning off the block selection Tr (SG) at 0V to ensure that the 5V voltage at the main bit lines (MBL) does not exit to the sub bit lines, i.e., by achieving a floating state.

FIG. 1 shows an equalizing circuit for a memory cell array in the prior art. It is constituted of word lines WLn, each connected with a control gate that is capacitively coupled with a floating gate, main bit lines MBLn and a common source line SL.

Each main bit line is further connected with a sub bit line SBLn via a block selection transistor BST (indicated as SG in the references, which constitutes a block selection line BSL when connected in parallel to word lines).

However, this method presents a problem in that since a delete is performed in large units of a plurality of blocks (>64 Kbytes according to the references), it is difficult to perform a delete in units of small sectors of 512 bytes each, as in a hard disk, necessitating much overhead in the system. To be more specific, while it is possible to perform a delete in units of word line sectors instead of in units of blocks by applying 10V only to, for instance, one word line instead of applying 10V to all the word lines within a selected block in a delete operation, it is difficult to assure a sufficient number of overwrite operations, since the disturbance becomes greater.

For instance, let us consider a situation in which a disturbance in the bit lines occurs during a write, with one block containing 64 word lines. In a block deletion, since bit line disturbances occur only while a write is performed once at each word line within the block after the deletion, even with an assured number of overwrite operations at 10,000, only 63 disturbances must be withstood. However, in order to assure the same number of overwrite operations in word line sector deletion, bit line disturbances 10,000 times greater than in block deletion, i.e. 63×10,000 must be withstood, making it difficult to assure a feasible number of overwrite operations for practical use.

Next, let us contemplate a P-well disturbance during a delete operation. In regard to the delete voltage in an FN tunnel-type flash memory, when the block selection line BSL, selected by applying, for instance, a positive 10V to the selected word line and applying, for instance −10V from the main bit line, is at 0V, the sub bit line selection transistor BST becomes turned on. This sets the sub bit line to −10V, and since the memory cell enters an on state at this point, a channel is formed, which sets the cell source to −10V as well as the cell drain. Because of this, if the source line is not divided into a main line and a sub line, all the sources and all the P-wells in the memory array are set to −10V. When the assured number of overwrites is 10,000, if the units of deletion are changed from blocks to word line sectors, the number of delete operations over which the P-well disturbance must be withstood increases from (the number of blocks in the same P-_well×10,000) to (the number of blocks in the same P-well×63×10,000), which means that the service life is reduced to 1/63 what it would otherwise be. In order to improve on this, it may be possible to perform deletions with a shallower negative voltage applied to the P-wells and an increased positive voltage at the selected word lines. In that case, however, it becomes necessary for the transistors constituting the word line drive circuit to withstand a higher voltage, which, in turn, will present problems such as reduced drive capability because of the increased size of the X-decoder and an increase in the film thickness of the gate oxide film.

In particular, during a data write, since 5V is applied to the sub bit lines in a selected group and the unselected word lines within the selected group become grounded, the 5V potential between the grounded word lines and the sub bit lines causes a disturbance on the sub bit lines within the selected group.

As a means for preventing this sub bit line disturbance, a positive potential may be LR applied to unselected word lines within the selected group during a data write in order to reduce the difference in potential between the unselected word lines and the sub bit lines.

However, since the memory cells corresponding to the word lines supplied with the positive potential enter an on state, a current will flow to their source line, necessitating a large current for the write operation. In addition, if the source lines are made to float in order to prevent the current from flowing to them, the source line potential increases, inducing a new disturbance-related problems.

SUMMARY OF THE INVENTION

Accordingly, an object of the present invention is to provide a semiconductor nonvolatile memory that is capable of preventing sub bit line disturbances without requiring the write current to be increased and without inducing new disturbance-related problems.

Another object of the present invention is to provide a source circuit that may be ideally employed for deleting and writing data in the semiconductor nonvolatile memory.

According to the present invention, an FN tunnel-type flash memory with which a small sector delete can be performed while assuring a sufficient number of overwrite operations is achieved by dividing the source line into main and sub source line and by adjusting the bias conditions to solve the problems discussed above.

The semiconductor nonvolatile memory according to the present invention, which is provided with a plurality of memory cells each having a control gate and a floating gate connected to a word line, a source connected to a source line and a drain connected to a bit line and enables data overwrite by employing an FN tunnel current, comprises sub bit lines to which the drains of the memory cells connected to a plurality of word lines are connected alternately in parallel for grouping the memory cells in units of the plurality of word lines, sub bit line selection transistors that connect the sub bit lines to the bit lines in such a manner that the connections can be interrupted, a sub source line connected to the sources of the memory cells in the blocks that are grouped by the sub bit lines and a block selection transistor that connects the sub source line to the source line in such a manner that the connection can be interrupted. In this semiconductor nonvolatile memory, prior to a data write into one or more memory cells, the sub bit line selection transistors and the block selection transistor involved in the same group interlock with each other to connect only the sub bit lines and sub source line involved in the selected group to the bit lines and the source lines respectively.

In the semiconductor nonvolatile memory according to the present invention, during a data write, through the operations of the sub bit line selection transistors and the block selection transistor which interlock with the bit line selection transistors, only the sub bit lines and the sub source line of the memory cells in the selected group become connected to the bit lines and the source line respectively. Thus, any electrical effect imparted by the bit lines and the source lines to the sub bit lines and the sub source line in other unselected groups is prevented.

Furthermore, by causing the two selection transistors, i.e., the bit line selection transistors and the block selection transistor to interlock with each other, it becomes possible to dispense with a separate control circuit for controlling the operation of the block selection transistor.

In addition, by connecting only the sub source line in the selected group to the source line and cutting off the sub source line in unselected groups from the source line during a data write through the operation of the block selection transistor, even if a positive potential is supplied to unselected word lines within the selected group in order to reduce the difference in potential between those word lines and the sub bit lines during the data write, the influence of the current flowing to the source line as a result and also the influence of the increase in the potential at the source line on the other groups can be minimized.

Consequently, the sub bit line disturbance described above can be prevented without resulting in new disturbance-related problems.

During a data write into the memory cells, the sub bit line selection transistors and the block selection transistor corresponding to the selected block are placed in a state of electrical continuity. In this state, a voltage corresponding to the data is applied to the sub bit lines in the selected block, a negative voltage is applied to the selected word lines within the same block, a positive voltage is applied to unselected word lines in the block and the sub bit line selection transistors and the block selection transistor corresponding to other blocks that have not been selected are placed in a cutoff state.

During a data delete from the memory cells, the sub bit line selection transistors and the block selection transistor corresponding to the selected block are placed in a state of electrical continuity. In this state, a negative voltage is applied to the sub bit lines within the selected block, a positive voltage is applied to the selected word lines within the same block and a negative voltage is applied to the unselected word lines within the block.

The source circuit according to the present invention is a source circuit for a semiconductor memory, which is mounted at a semiconductor substrate in which a memory having a plurality of memory cells is mounted and generates a bipolar voltage for performing a data write to, and a data delete from the memory. The source circuit comprises a CMOS which is constituted by mutually connecting in series the source or the drain of an NMOS which is formed in a first substrate portion having a gate and the source or the drain of a PMOS which is formed in a second substrate portion whose conduction type is different from that in the first substrate portion, having a gate with a positive potential and a negative potential applied to the two ends toward the PMOS side and toward the NMOS side and an output potential extracted from the area in which the two MOS transistors are connected, a means for voltage application that selectively applies a first intermediate potential, which is lower than the potential applied to the PMOS side and higher than the potential applied to the NAMOS side, to the gate of the PMOS and a second means for voltage application that selectively applies the potential applied to the NMOS side and a second intermediate potential, which is lower than the potential applied to the NAMOS side and higher than the potential applied to the PMOS side, to the gate of the NMOS.

In the source circuit according to the present invention, if a positive potential, for instance, is applied to the CMOS at the PMOS side and a negative potential is applied to the CMOS at the NMOS side, the PMOS is set in a cutoff state by applying the positive potential to the gate of the PMOS and the NMOS is set in a state of electrical continuity by applying the second intermediate potential that is lower than the positive potential to the gate of the NMOS, thereby making it possible to output the negative potential at the NMOS side as the output voltage.

In addition, by applying the negative potential to the gate of the NMOS, the NMOS is set in a cutoff state and by applying the first intermediate potential that is higher than the negative potential to the gate of the PMOS, the PMOS is set in a state of electrical continuity, thereby making it possible to output the positive potential at the PMOS side as the output voltage.

As a result, the PMOS is set in a state of electrical continuity without having to apply the negative potential at the NMOS side, which has a large difference in potential from the source potential at the PMOS to the gate of the PMOS, and, in addition, the NMOS is set in a state of electrical continuity without having to apply the positive potential at the NMOS side which has a large difference in potential from the source potential at the NMOS to the gate of the NMOS.

While, in the prior art, the negative potential is applied as a gate voltage in order to achieve electrical continuity for the PMOS and the positive potential is applied as a gate voltage to achieve electrical continuity for the NMOS, with the source circuit according to the present invention, the individual gate voltages can be set low compared to those in the prior art and, thus, a reduction in the thickness of the gate oxide film can be achieved as a result of the reduction in the gate voltages.

The source circuit according to the present invention may be incorporated with the semiconductor nonvolatile memory according to the present invention and by doing so, the thicknesses of the individual gate oxide films at the NMOS and the PMOS transistors of the CMOS in the source circuit are prevented from exceeding the film thickness of the tunnel oxide film in the memory cell. This, in turn, achieves a great advantage in manufacturing a semiconductor nonvolatile memory with an incorporated source circuit.

The first and second means for voltage application in the source circuit may be each constituted of a CMOS which, in turn, is constituted of a PMOS and an NMOS which are formed in different substrate portions from each other and are mutually connected in series, each having a gate.

The potential in the connection area of the PMOS and the NMOS in the first means for voltage application is applied to the gate of the PMOS, which is supplied with a voltage by the first means for voltage application, whereas the potential in the connection area of the PMOS and the NMOS in the second means or voltage application is applied to the gate of the NMOS, which is supplied with a voltage by the second means for voltage application. The substrate portion of the PMOS in the first means for voltage application is connected to the first substrate portion with the substrate portion of the NMOS in the first means for voltage application having the first intermediate potential, whereas the substrate portion of the NMOS in the second means for voltage application is connected to the second substrate portion with the substrate portion of the PMOS in the second means for voltage application having the second intermediate potential.

The individual substrate portions in the source circuit may be constituted of wells formed in the semiconductor substrate.

In addition, the areas with high impurity content in the individual drains of the PMOS and the NMOS supplied with the gate voltages by the first and second means for voltage application in the source circuit can be offset so that they are further away from the corresponding MOS gates than the central lines of the drains, thereby achieving an improvement in the voltage withstand characteristics between the gates and the drains of the PMOS and the NMOS.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings:

FIGS. 3(a) and 3 (b) are cross section of the memory array in the prior art and, (a) describes selected sector and FIG. 3(b) describing an unselected sector;

FIG. 6 is a table of voltages applied during a write in the first embodiment according to the present invention;

FIG. 8 is a table of voltages applied during a delete in the second embodiment according to the present invention;

FIG. 9 is a table of voltages applied during a delete in the fourth embodiment according to the present invention;

FIG. 12 illustrates the source circuit according to the present invention;

FIG. 13 is a table of the operating voltages in the source circuit according to the present invention;

FIG. 15 is a table of the logical values in the word line selection circuit according to the present invention;

FIG. 17 is a table of voltages in the source circuit according to the present invention.

DETAILED DESCRIPTION OF THE PREFERRED EMBODIMENTS

Figure 4:
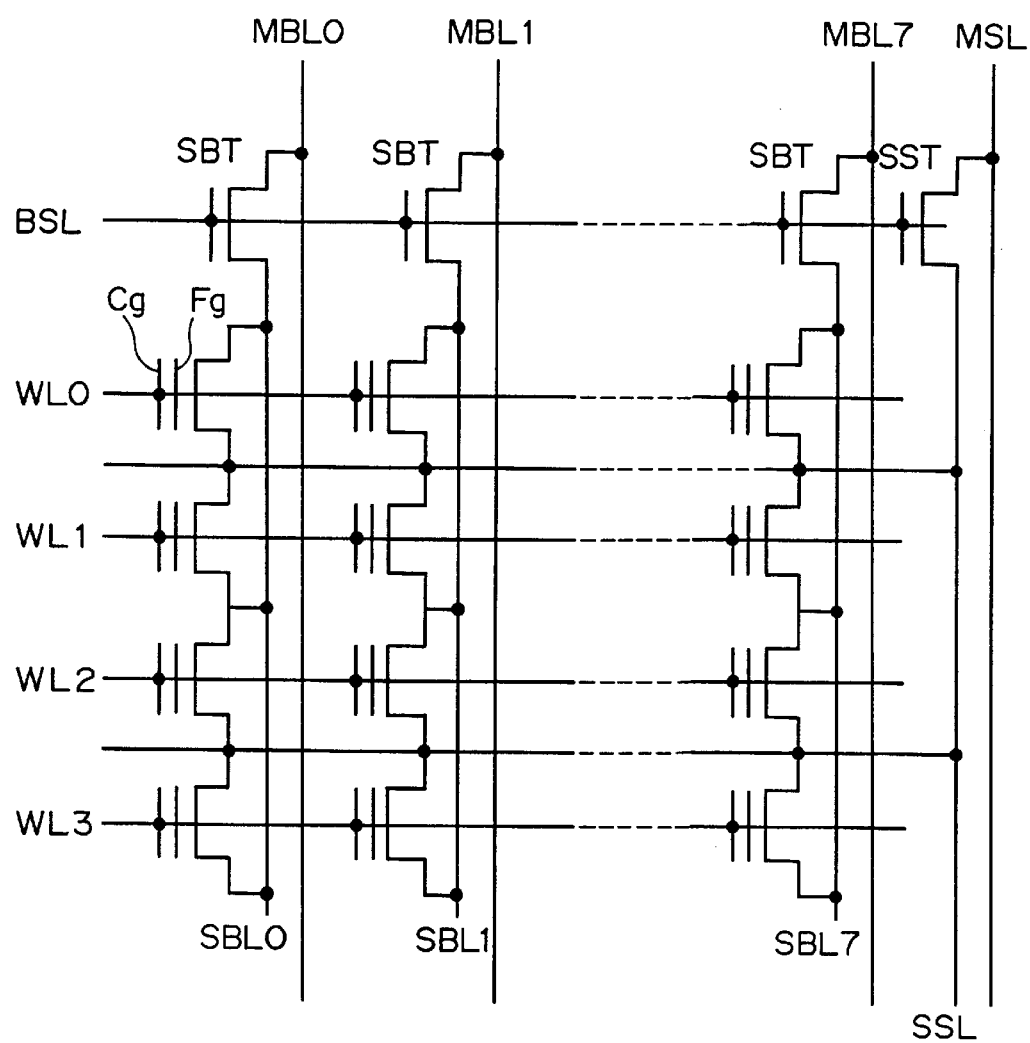
FIG. 4 is a circuit diagram of the memory array equalizing circuit according to the present invention.
Figure 5:
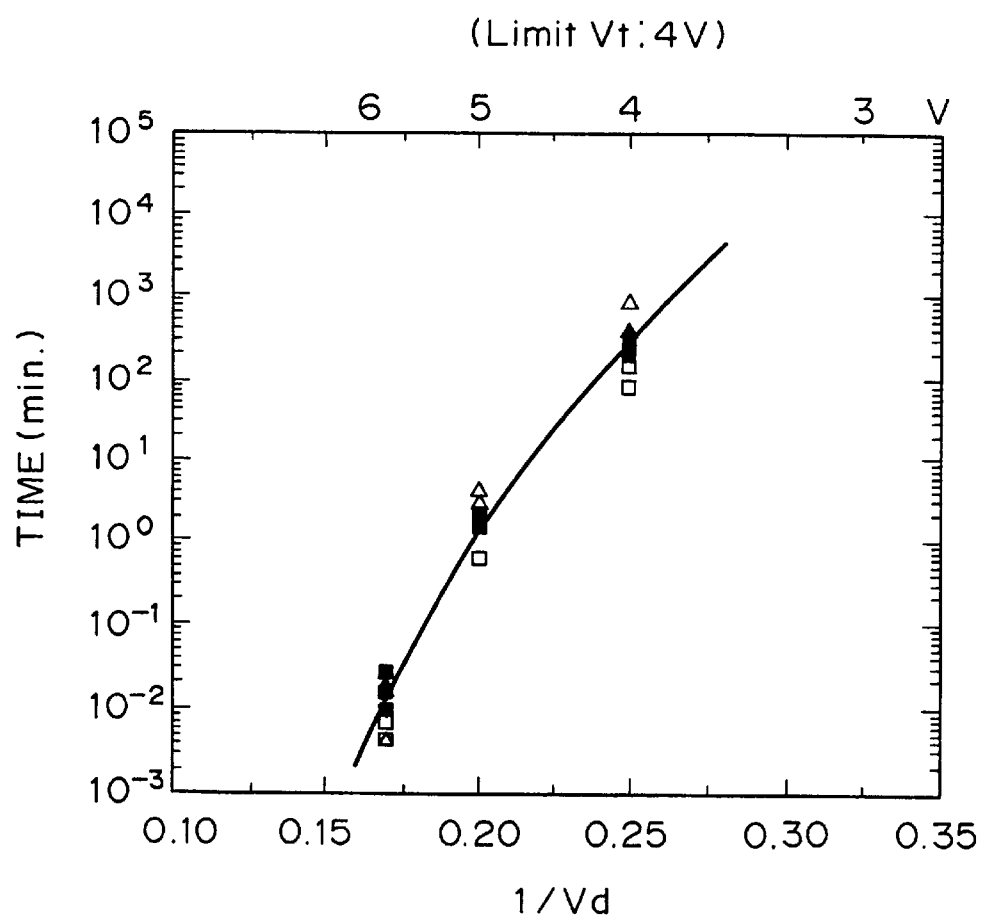
FIG. 5 is a graph indicating the relationship between the bit line voltage and durability against disturbance.
Figure 7:
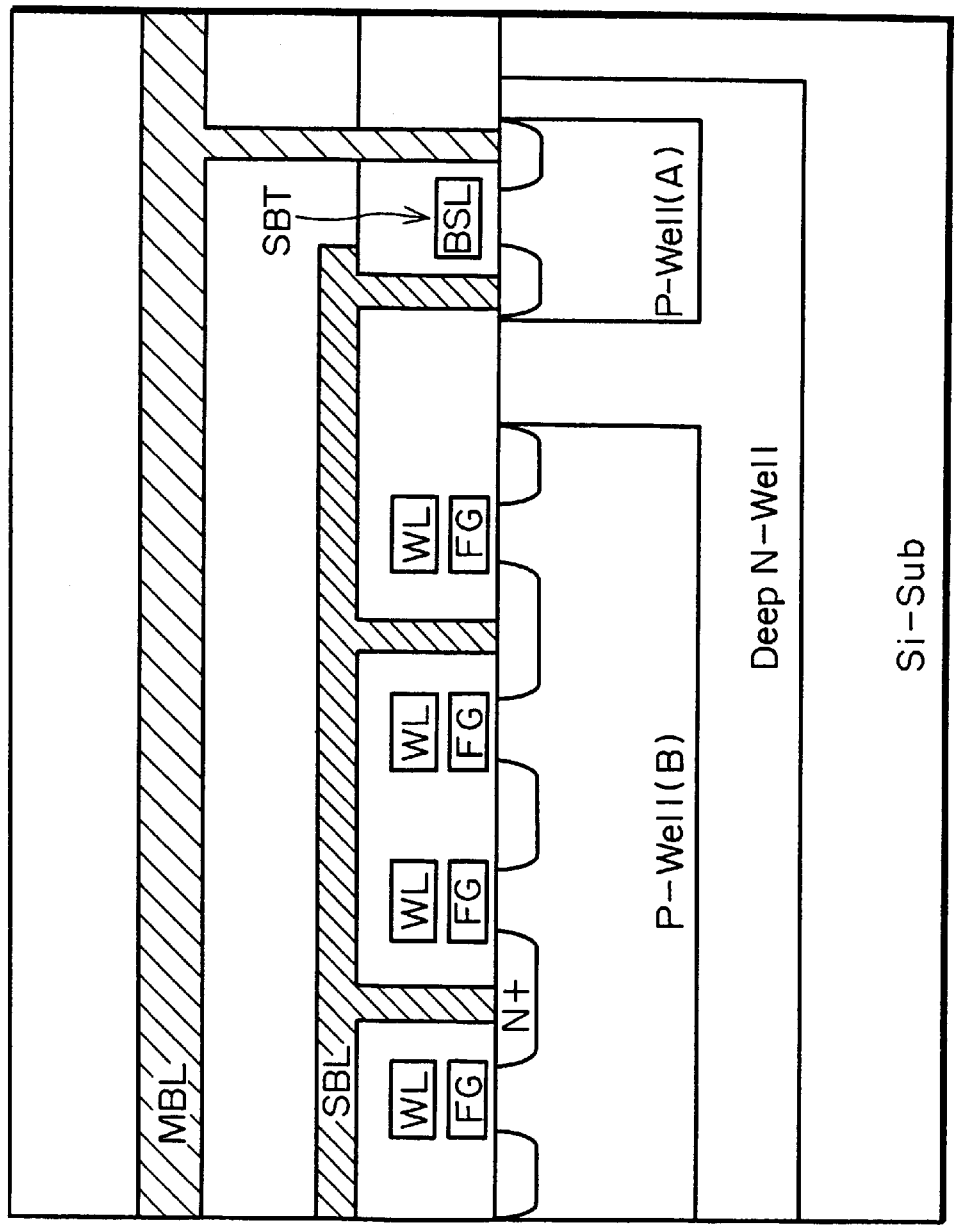
FIG. 7 is a cross section of the memory array according to the present invention.

FIG. 4 shows the memory array equalizing circuit illustrating the first embodiment of the NOR type semiconductor nonvolatile memory according to the present invention. Unlike the method in the prior art, which employs a common source line, it adopts a structure in which separate source lines, i.e., a main source line MSL and a sub source line SSL, which is connected to the source line via a source selection transistor, i.e., a block selection transistor SST in such a manner the connection can be interrupted are provided.

The source selection transistor, i.e., the block selection transistor SST, is connected together with sub bit line selection transistors SBT by a common gate line to constitute a block selection line BSL. The block selection transistor SST and the bit line selection transistors SBT interlock with each other to cause the sub bit lines SBL in individual corresponding blocks to connect with the main bit line MBL and the sub source line to connect with the main source line MSL in such a manner the connection can be interrupted, so that the sub bit lines SBL and the sub source line SSL can be separated from the main bit lines MBL and the main source line MSL for each block.

When achieving this structure, it is desirable to form the sub bit lines and the sub source line of the same material and to form the main bit lines and the main source line of the same material although different from the material constituting the sub bit lines in order to reduce production costs.

Next, the bias application method employed in this structure is explained.

When writing data "0" in the memory cell at an intersection of a given word line within the block, i.e., at the intersection of the word line WL1 and the sub bit line SBL1 in FIG. 4, for instance, a negative voltage of −8V is applied to the selected word line WL1, a voltage of 5V is applied to the selected main bit line MBL1, the block selection line BSL constituting the common gate line is set to 8V and the main bit line MBL1 and the sub bit line SBL1 are set in a state of electrical continuity to induce electrons from the floating gate into the drain of the memory cell at the intersection.

At this point, in order to prevent a bit line disturbance, a positive voltage of 2V–4V is applied to the other word lines WL0, WL2, WL3 and the like within the same block that have not been selected. With this positive voltage applied, the memory cells on the sub bit line SBL1 are turned on, i.e., become electrically continuous, and the sources, the selected block and the main source line, i.e., the source line MSL, become biased to a positive voltage corresponding to the memory cell Vth of approximately 0.5V–2V. However, by setting the main source line MSL in a floating state during a write, no through current flows. In addition, the sources of the other blocks, i.e., the unselected blocks, are separated from the main source line MSL by the block selection transistor SST, thereby making it possible to keep the current for capacitive charge related to the main source line at a limited value.

Figure 1:
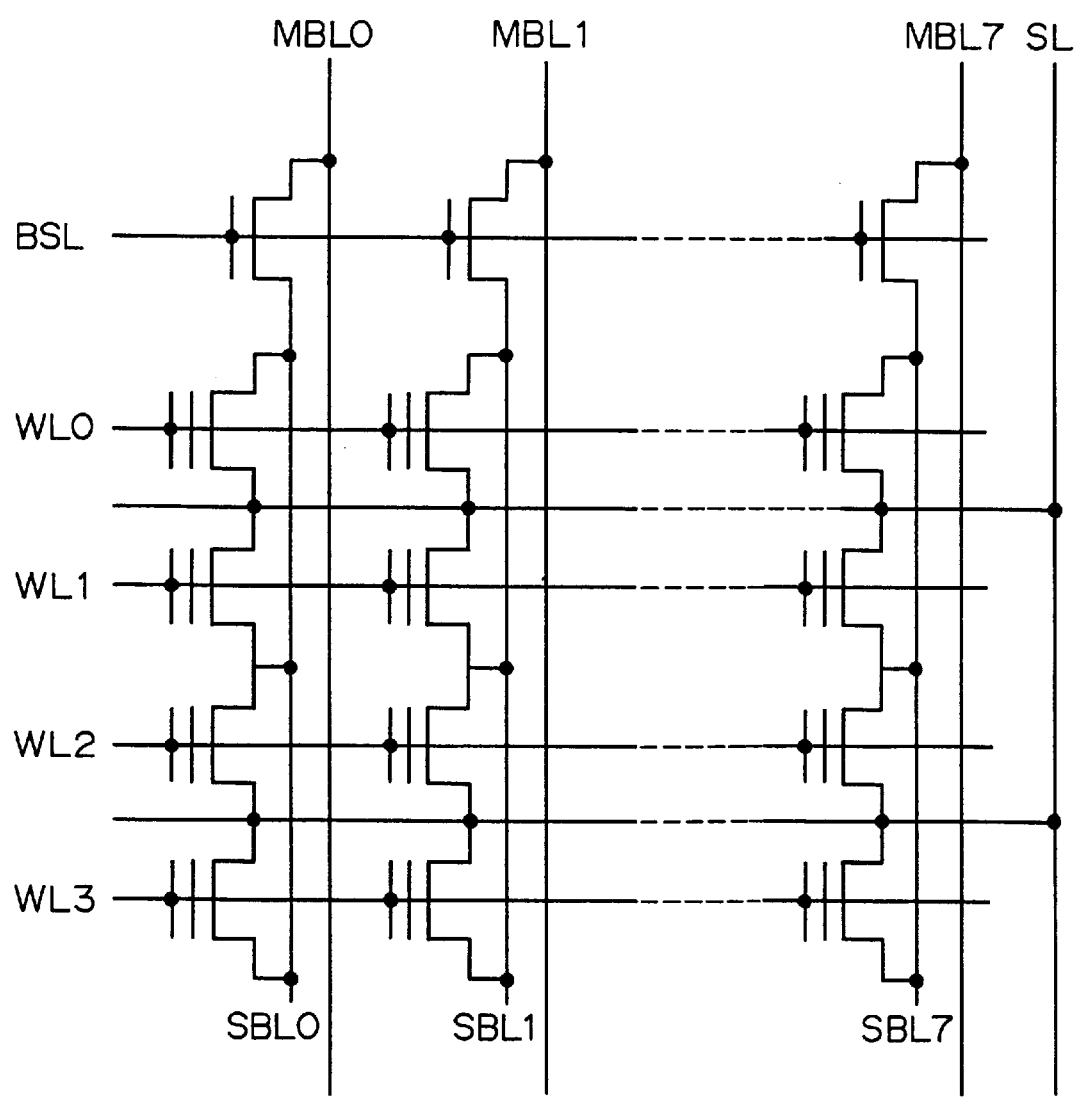
FIG. 1 is a circuit diagram of a memory array equalizing circuit in the prior art.
Figures 2A, 2B:
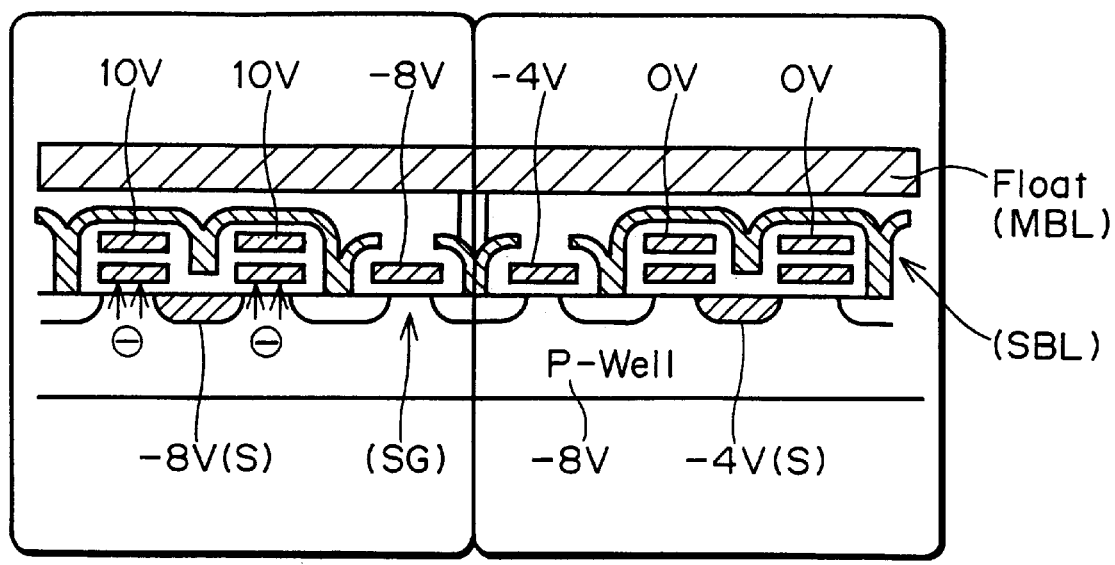
FIG. 2(a) and 2(b) are cross section of the memory array in the prior art, FIG. 2a describing a selected sector (b) and FIG. 2(b) describing an unselected sector.
Figures 3A, 3B:
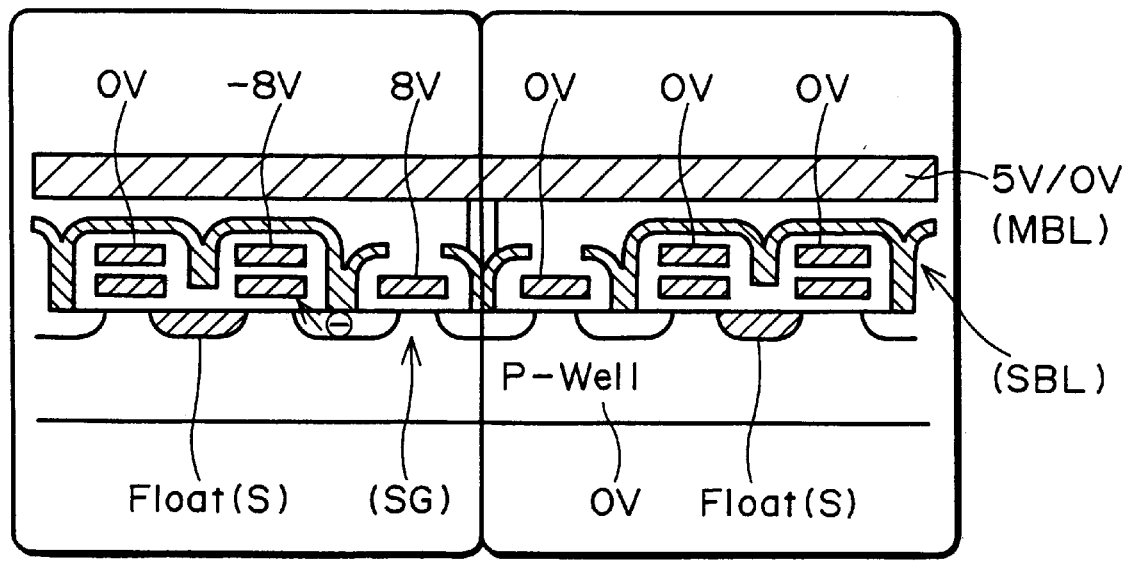

By applying a positive voltage to unselected word lines within a block in this manner, the difference in the potential between the sub bit line SBL1 and the unselected word lines WL0, WL2, WL3 and the like can be reduced to half or less, i.e., from 5V in the prior art to 1–2V. Thus, it becomes possible to improve the durability against bit line disturbance by several orders of magnitude (see FIG. 3).

The effect of the sources of the memory cells within a selected block becoming biased by a positive voltage may manifest in a disturbance imposed upon the source side by the "1" data at the selected word line WL1 and a reduction in the efficiency with which the "0" data are written in the selected word line WL1 due to source coupling. However, by adjusting the threshold value Vth of the memory cells in the "0"0 state or by adjusting the voltage applied to unselected word lines so that the source voltage is at approximately 1V or less, these adverse effects can be minimized to insignificance.

By achieving such a structure, even if a write is performed in units of small sectors instead of in units of blocks, it becomes possible to withstand the bit line disturbance.

FIG. 6 presents an example of a set of voltage values applied to the individual lines during the write operation described above.

The second embodiment of the present invention is explained below. In order to achieve a delete in units of small sectors and also to assure a sufficient number of overwrite operations, an improvement in the measures against P-well disturbance during a delete should be achieved as well as achieving the memory cell structure and the bias conditions that withstand the bit line disturbance as disclosed in reference to the first embodiment.

The P-well (A) which contains the sub bit line selection transistor SBT and the P-well (B) which contains the individual memory cell block are separated from each other (see FIG. 4). During a delete, with −10V applied to unselected word lines WL, since the sub bit line selection transistor SBT is turned off and the P-well (A) containing the sub bit line selection transistor SBT is separated from the P-well (B) within the selected block, the unselected sub bit line selection transistor SBT and the P-well (B) in the unselected block remains in a floating state.

At this point, it is crucial that separate source lines are provided, i.e., the main source line MSL and the sub source line SSL, for maintaining the potential of the unselected P-well (B) in a floating state, since if there is only a main source line constituting a single source line, all the sources are set to a negative voltage and thus, the memory cells Tr become electrically continuous causing the sub bit lines SBL and all the P-wells (B) in all the blocks, including unselected blocks, to become biased to −10V.

By achieving the structure described above, the P-well disturbance can be contained within the selected block and, therefore, the P-well disturbance is reduced, compared to the prior art, by the number of blocks constituting the memory array.

By employing the first embodiment according to the present invention for a write and adopting this embodiment for a delete, it becomes possible to perform an overwrite in units of small sectors.

FIG. 8 presents an example of a set of voltage values applied to the individual lines during the delete operation described above.

The third embodiment of the present invention is explained below. In the second embodiment, the P-well (B) of the memory cell block and the P-well (A) containing the sub bit line selection transistor SBT are separated from each other. When separating the two wells (A) and (B), which are formed through ion implantation of boron (100 KeV, 2×10 to the 13 power/square cm) followed by a drive in (1150° C. for 200 minutes) to have the depth of, for instance, 2 micometer, the boron will become dispersed in the lateral direction as well, necessitating a large distance between the P-well (A) and the P-well (B) of, for instance, 4 micrometer, which presents a problem in that the cell area must be increased.

By employing an ion implantation apparatus capable of imparting acceleration energy of several MeV to ions to implant ions of, for instance, boron in a dose of 5×10 to the 12 power/square cm each at acceleration energies of 100 KeV, 250 KeV, 500 KeV, 750 KeV and 1 MeV and then by performing light annealing at approximately 1000 C. degree for 100 minutes to activate the impurities, the lateral dispersion of the boron can be inhibited, thereby making it possible to set a small distance between the P-well (A) and the P-well (B) at approximately 2 µmicrometer.

An overwrite in units of small sectors becomes possible by adopting the first embodiment according to the present invention for the write and adopting this embodiment for a delete.

The fourth embodiment of the present invention is next explained. In regard to the P-well disturbance during a data delete, since a voltage is applied to a selected block, if a delete is to be performed in units (sectors) of word lines, it becomes necessary to withstand the P-well disturbance, the quantity of which corresponds to the number of word lines within the selected block. This poses a problem in that the P-well potential during a delete cannot be deepened because of it.

To deal with this problem, the P-well disturbance may be attenuated by applying a negative voltage to unselected word lines within the selected block. Un reality, by setting the unselected word lines to −5V, it is possible to achieve an improvement in regard to the number of times compensation is required by more than several orders of magnitude compared to a case in which the unselected word lines are set to 0V. At this point, by applying −10V to the unselected block selection lines BSL to turn off the sub bit line selection transistors SBT and by setting the unselected sub bit lines and unselected sub source line in a floating state, the P-well disturbance in unselected blocks can be minimized.

In other words, while, if the P-well (B) of the memory array is not separated from the P-well (A), the P-well potential is set to −10V, since the sources and the drains of the memory cells in the unselected blocks are in a floating state, these sources and drains are charged to achieve a certain level of negative voltage, thereby making it possible to prevent the P-well disturbance. The sources in the unselected blocks can be kept in a floating state since there are separate source lines, i.e., the main source line and the sub source line, connected in such a manner that the connection can be interrupted.

An overwrite in units of small sectors can be achieved by adopting the first embodiment according to the present invention for a write and adopting this embodiment for a delete.

FIG. 9 presents an example of a set of voltage values applied to the individual lines during the delete operation described above.

Next, the fifth embodifourth embodiment,t invention is explained. While, in the fourth embodiment, the P-well disturbance is attenuated by applying a negative voltage to unselected word lines WL, there is a likelihood of P-well disturbance occurring in unselected blocks since the P-well is not separated as in the second and third embodiments.

Thus, by dividing the P-well into the P-well (A) and the P-well (B), as in the second embodiment and the third embodiment of the present invention and also by applying a negative voltage to unselected word lines within a selected block, as in the fourth embodiment of the present invention, the P-well disturbance can be prevented both in the selected block and in the unselected blocks.

An overwrite in units of small sectors can be achieved by adopting the first embodiment according to the present invention for a write and adopting this embodiment for a delete.

The values of the voltages applied to the individual lines in this operation may be set identical to those in the example in FIG. 9.

The sixth embodiment of the present invention is now explained. In the first to fifth embodiments of the present invention, positive and negative voltages, i.e., bipolar voltages must be applied to selected and unselected word lines, and this presents a circuit problem in order to obtain a specific source. In particular, in the fourth and fifth embodiments of the present invention, it is necessary to bias the selected word line and the unselected word lines to voltages with inverse signs. In this embodiment, a word line drive circuit for this purpose is achieved.

Figure 10:
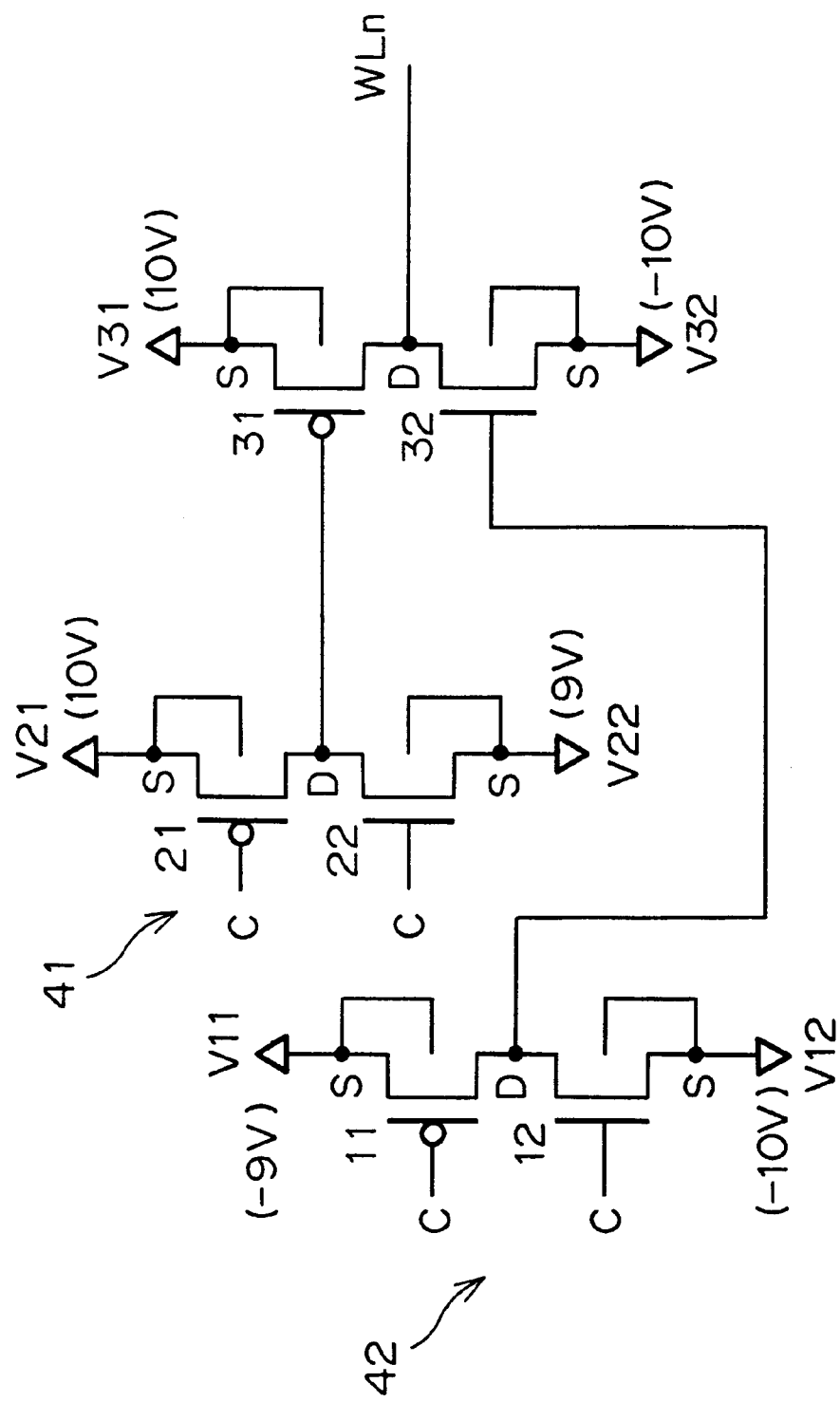
FIG. 10 is a circuit diagram of the word line drive circuit according to the present invention.
Figure 11:
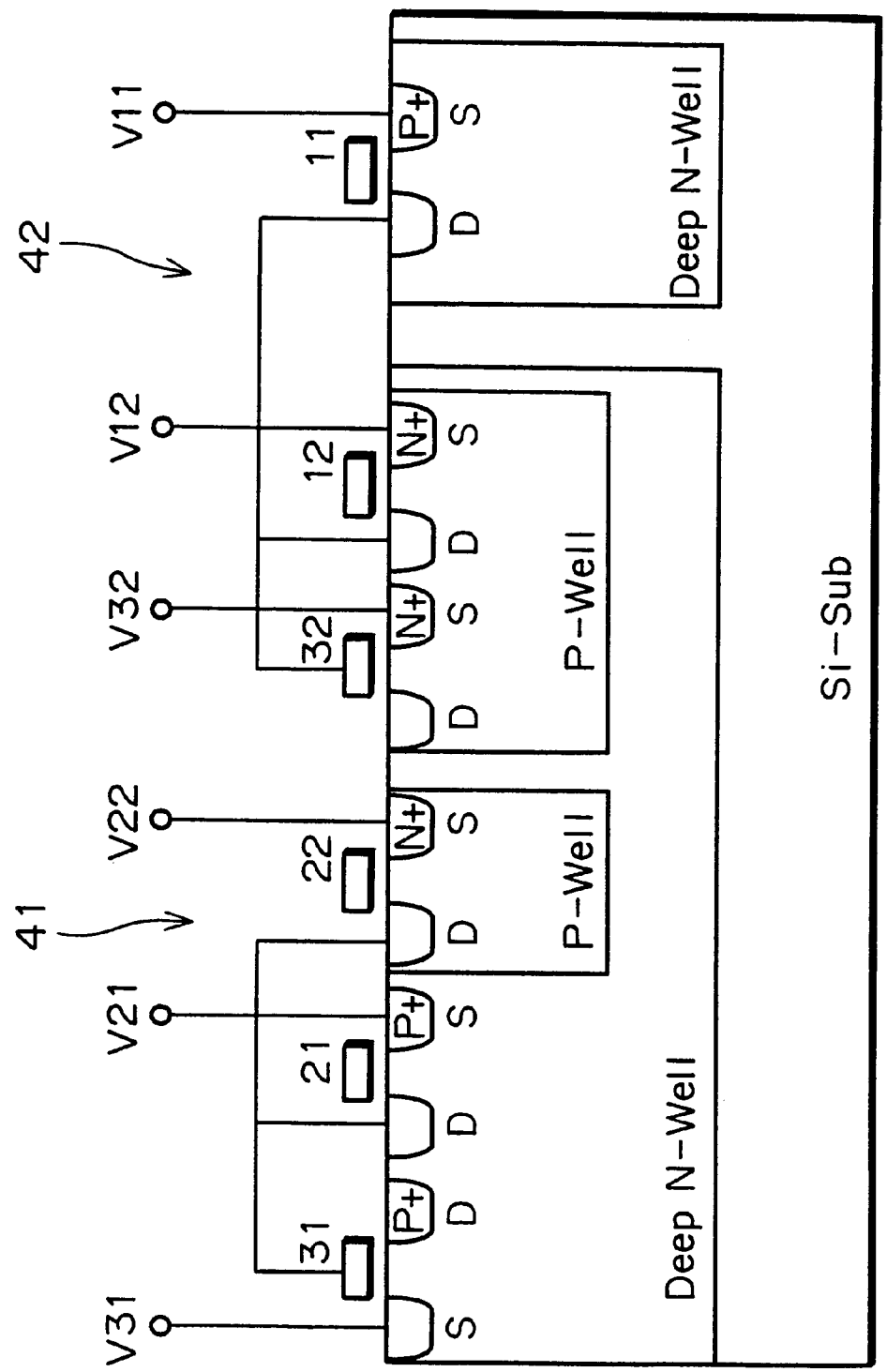
FIG. 11 is a cross section of the word line drive circuit according to the present invention.

FIG. 10 is a circuit diagram of a source circuit which is incorporated in the memory chip as one of the peripheral circuits, i.e., as a word line drive circuit, and FIG. 11 is a schematic cross section of this word line drive circuit.

In the word line drive circuit, i.e., the source circuit according to the present invention, the word line WLn is connected to the drain of a PMOS 31 and the drain of an NMOS 32. Two MOS transistors 31 and 32 constitute a CMOS formed with their respective drains mutually connected in series, and the connection portion of the two MOS transistors is connected to word line WLn as an output potential.

In reference to FIG. 10, the source of the PMOS 31 and the N-well which constitutes the substrate portion of the PMOS are connected to a source V31, and this makes the substrate potential of the PMOS 31, i.e., the N-well potential, equal to the positive voltage V31, e.g., 10V, which is applied to the PMOS side of the CMOS. In addition, the source of the NMOS 32 and the P-well potential constituting the substrate portion of the NMOS are connected to a negative voltage V32, e.g., −10V, which is applied to the NMOS side of the CMOS. Thus, the substrate potential of the NMOS 32, i.e., its P-well, is formed in the P-well, which is located within the deep N-well formed at the silicon substrate in which the memory is mounted and is, therefore, electrically separated from the substrate.

The gate of the PMOS 31 is connected with a first means for voltage application 41, which is constituted of a CMOS comprising a PMOS 21 and an NMOS 22 and the PMOS 31 is driven by the first means for voltage application 41.

In reference to FIG. 11, the source of the PMOS 21 in the first means for voltage application 41 and the N-well of the PMOS are connected to a source V21, and the source of the NMOS 22 and the P-well of the NMOS are connected to a source V22.

A voltage, i.e., V21, that is equal to a source V31 is applied to the PMOS 21 side of the CMOS 21 and 22 constituting the first means for voltage application 41. As a result, the N-well of the PMOS 21 and the N-well of the PMOS 31 can be constituted as a common N-well.

Now, a voltage which is lower than the voltage of the source V31 and higher than the source V32, i.e., an intermediate voltage, i.e., V22, between the values of the two voltages V31 and V32, e.g., 9V, is applied to the NMOS 22 side of the CMOS 21 and 22 constituting the first means for voltage application 41. Thus, the P-well of the NMOS 22 is constituted of a P-well which is electrically cut off from the P-well of the NMOS 32.

The potential at the connection area of the two MOS transistors 21 and 22 is supplied to the gate of the PMOS 31 as a drive output.

A second means for voltage application 42 which is constituted of a CMOS comprising a PMOS 11 and an NMOS 12 is connected to the gate of the NMOS 32, and the NMOS 32 is driven by the second means for voltage application 42.

The source of the PMOS 11 in the second means for voltage application 42 and the N-well of the PMOS are connected to a source V11, and the source of the NMOS 12 and the P-well of the NMOS are connected to a source V12.

A voltage that is equal to the source V32 is applied to the NMOS 12 side, i.e., the V12 of the CMOS 11 and 12 constituting the second means for voltage application 42. As a result, the P-well of the NMOS 12 and the P-well of the NMOS 32 can be constituted as a common P-well.

Now, a voltage, i.e., V11, which is higher than the voltage of the source V32 and lower than the source V31, i.e., an intermediate voltage between the values of the two voltages V31 and V32, e.g., −9V, is applied to the PMOS 11 side of the CMOS 11 and 12 constituting the second means for voltage application 42. Thus, the N-well of the PMOS 11 is constituted of an N-well which is electrically cut off from the N-well of the PMOS 31 and the PMOS 21.

The potential at the connection area of the two MOS transistors 11 and 12 is supplied to the gate of the NMOS 32 as a drive output.

The gates of the PMOS 21 and the NMOS 21 are driven by a signal C. The gates of the PMOS 11 and the NMOS 11, too, are driven by the signal C.

FIG. 11 illustrates the logic of the signal C, and the signal C can take the logic as illustrated in FIG. 8.

The method for generating the signal C will be detailed later, and in reference to this embodiment, the operation of the source circuit, i.e., the word line drive circuit shown in FIGS. 8 and 9 is described. As shown in FIG. 12, the signal C is set to L during a write and is set to H during a delete/read out at a selected word line WL.

Consequently, by setting 3V and 0V respectively for the sources V21 and V22 during a write, the output from the first means for voltage application (PMOS 21/NMOS 22) 41 is at 3V at the selected word line WL and at 0V at unselected word lines WL.

In addition, by setting 0V and −8V respectively for the sources V11 and V12, the output from the second means for voltage application (PMOS 11/NMOS 12) will be at 0V at the selected word line WL and at −8V at unselected word lines WL. At this point, 3V and −8V are applied to the source V31 and the source V32 respectively of the CMOS (PMOS 31/NMOS 32) constituting the word line driver. Thus, −8V is supplied to the selected word line WL, whereas 3V is supplied to unselected word lines WL. By applying the voltages described above to the word lines WL in this manner, the disturbance during a write can be attenuated.

As shown in FIG. 12, the signal C is set to H at the selected word line WL and set to L at the unselected word lines WL during a data delete. Thus, by setting 10V and 0V for the sources V21 and V22 respectively, the output from the first means for voltage application (PMOS 21/NMOS 22) 41 will be at 0V at the selected word line WL, and since the source V31 is set at 10V, too, the voltage 10V is applied to the selected word line WL. At this point, since −10V is applied to the P-well (B) which includes the memory cell, only the data at the selected word line are deleted, i.e., the data are deleted in units of small sectors.

At this time, by setting 0V and −3V respectively for the sources V11 and V12, the output from the second means for voltage application (PMOS 11/ NMOS 12) 42 will be at −3V during the output to the selected word line, setting the NMOS 32 in an off state. As a result, if the source V32 is set at the same voltag level, i.e., −3V, the output from the second means for voltage application (PMOS 11/ NMOS 12)42 will be at 0V during the output to the unselected word lines WL, thereby biasing the unselected word lines to −3V to attenuate the P-well disturbance.

By setting 3V (Vcc) for the sources V11, V21 and V31 at the high side and setting 0V (Vss) for the sources V12, V22 and V32 at the low side, it is possible to control the selected/unselected word lines during a read.

The operation described above is summarized in FIG. 13 which presents the operating voltages.

The individual biases shown in FIG. 13 indicate that the difference in potential between the selected word line and the unselected word lines is large at 11V and 15V respectively during a write and a delete, and although it is necessary to withstand these potential differences as the drain junction withstand voltages for the NMOS and the PMOS by distributing a voltage to the well (B) constituting the substrate portion as in the present invention, the thickness of the gate oxide film can be reduced, thereby achieving an increase in the drive capability of the transistor.

Now, the seventh embodiment of the present invention is explained. While the method for achieving the logic of the signal C has not been explained in reference to the sixth embodiment, an example for achieving this logic is disclosed in reference to this embodiment.

Figure 14:
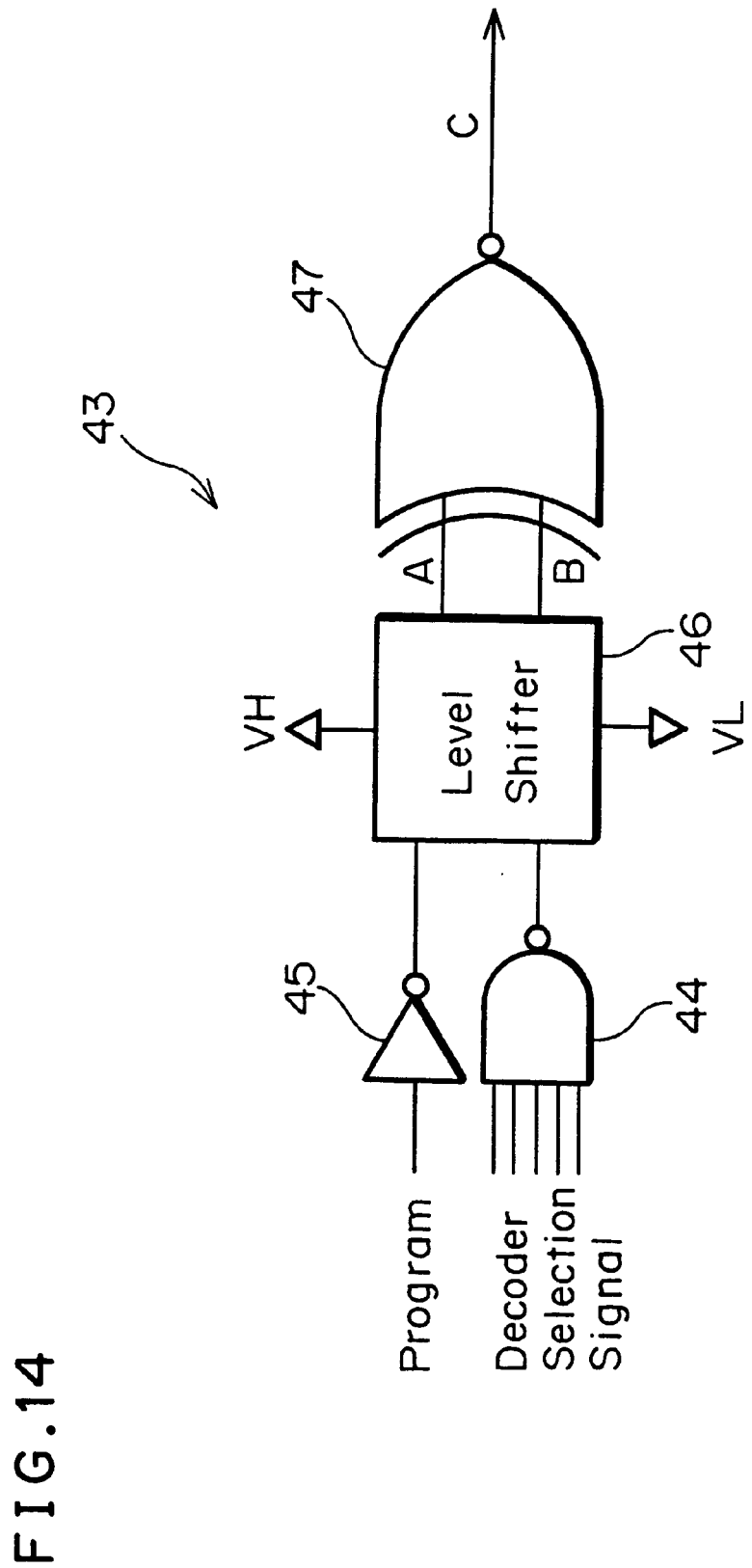
FIG. 14 is a circuit diagram of the word line selection circuit according to the present invention.
Figure 16:
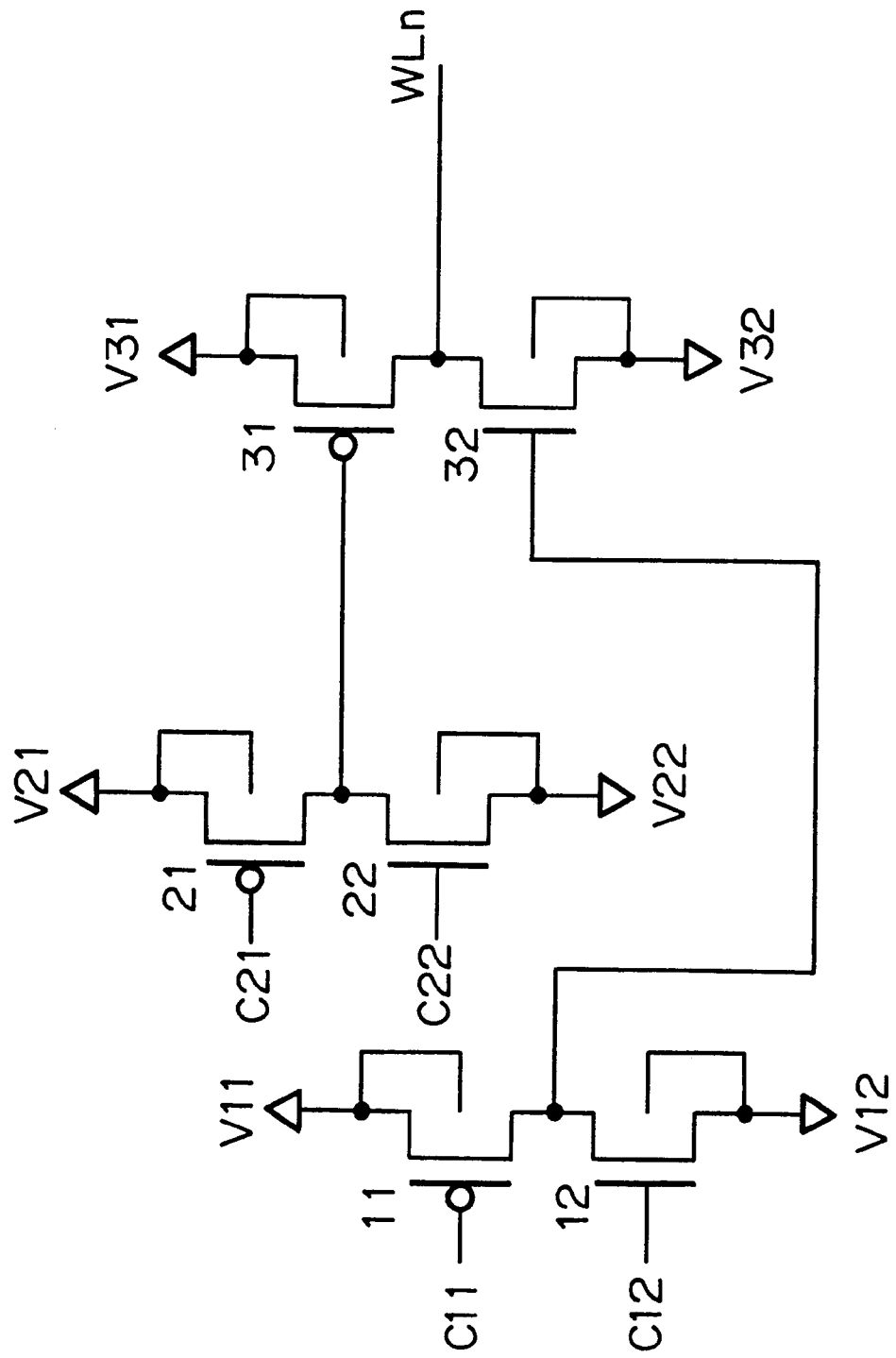
FIG. 16 is a circuit diagram of the word line drive circuit in another embodiment according to the present invention.

FIG. 14 shows a word line selection circuit 43 in this embodiment.

The word line selection circuit 43 is provided with a NAND 44 that receives a decoder selection signal, an invertor 45 that receives a program signal which is set to high during a write and a level shifter 46 that receives the inverted (PROGRAM-B) output from the invertor and the output from the NAND 44.

The output from the level shifter 46 is input to an XNOR (exclusive OR) 47. The relationships between the input of the level shifter 46 and an output node A and between the input of the level shifter 46 and an output node B are shown in the logical value table presented in FIG. 15. In reality, simplicity and convenience are achieved if these relationships are achieved by controlling the node A with the PROGRAM-B and controlling the node B with the decoder signal.

The level shifter 46 may be employed to drive, for instance, the first means for voltage application (PMOS 21/NMOS 22) 41 in the word line drive circuit shown in FIG. 10 as the sixth embodiment. Sources VH and VL of the level shifter 46 respectively correspond to the sources V21 and V22 and 3V and 0V are respectively set for them during a write, whereas 10V and 0V are respectively set for them during a delete. In addition, the level shifter 46 is capable of driving the second means for voltage application (PMOS 11/NMOS 12) 42, and in that case, its sources VH and VL respectively correspond to the sources V11 and V12, with 0V and −8V respectively set for them during a write and 0V and −5V respectively set for them during a delete.

The signal C in FIG. 15 is obtained when the nodes A and B are received by the XNOR (exclusive OR) 47. It is possible to switch selected/unselected by using a different logic for a write than is used for a delete/read out with this output signal C, thereby facilitating the application of a positive voltage to a selected word line during a delete and a read out and the application of a negative voltage to a selected word line during a write, which, in turn, makes it possible to reduce the voltage that must be withstood by the gate oxide film compared to the junction voltage withstand to achieve a reduction in the film thickness of the gate oxide film and an improvement in the drive capability.

The eighth embodiment of the present invention is next explained. In the sixth and seventh embodiments, the source V22 and the source V11, which are intermediate sources to reduce the voltage applied to the gate oxide film, are set at 0 for both a write and a delete.

However, this means that a voltage close to 10V is still applied to the gate oxide films of the PMOS 31 and the NMOS 32 and may cause a reliability-related problem if the gate oxide films are made too thin, for instance, at a thickness of 120 angstrom.

In the eighth embodiment, as shown in FIGS. 14 and 15, by employing different voltages for the source V11 and the source V22, it becomes possible to further reduce the difference between the potentials at the gate electrode and the source V31 at the source side of the PMOS 31.

For instance, if V11 is set to −3V instead of 0V during a write, the difference between the potentials at the gate and the source of the NMOS 32 is reduced to −5V from −8V. Likewise, by setting V22 at 5V instead of 0V during a delete, the difference between the potentials at the gate and the source of the PMOS 31 is reduced to 5V from 10V.

Consequently, it is possible to reduce the voltage applied to the gate oxide films during a delete/write to 5V or less and, therefore, any reliability-related problems that may otherwise occur are avoided, even if the film thickness of the gate oxide film is set at 150 angstrom or less.

The ninth embodiment of the present invention is next explained. It is difficult to assure data holding and overwrite durability for 10 years or more with the film thickness of the tunnel oxide film under the floating gate of a flash memory set at 90 angstrom or less and with the voltage required for overwrite set at 10V or less.

However, by expanding the concept of the eighth embodiment, which demonstrates that by driving the gate with Tr of different wells, the voltage applied to the gate oxide film can be restricted to a desired level or less, we reach the conclusion that by further reducing the difference between the potentials at the sources V21 and V31 and the source V22, the difference between the potentials at the sources V12 and V32 and the source V22 and the difference between the potentials at the sources V12 and V32 and the source V11, the maximum voltage applied to the gate oxide film in, for instance, a peripheral circuit, can be limited to, for instance, 2V, 1V or less.

In other words, it is possible to set the film thickness of the gate oxide film at a value less than 90 angstrom, e.g. at 50 angstrom.

In addition, according to the present invention, any restrictions that may otherwise be imposed upon the film thickness of the gate oxide film in the peripheral Tr are eliminated, and a flash memory with the film thickness of the gate oxide film in a peripheral circuit such as a decoder drive circuit set smaller than the film thickness of the tunnel oxide film in the flash memory cell can be achieved.

Moreover, while it is necessary to provide the gate oxide films in two different film thicknesses for flash and logic in the prior art in response to the market demand for realizing a device combining flash memory and advanced logic with a gate oxide film with a film thickness of, for instance, 50 angstrom, according to the present invention the film thickness of the gate oxide film in the logic device can be also set for the flash memory, thereby making it possible to achieve a high performance hybrid device.

Figure 18:
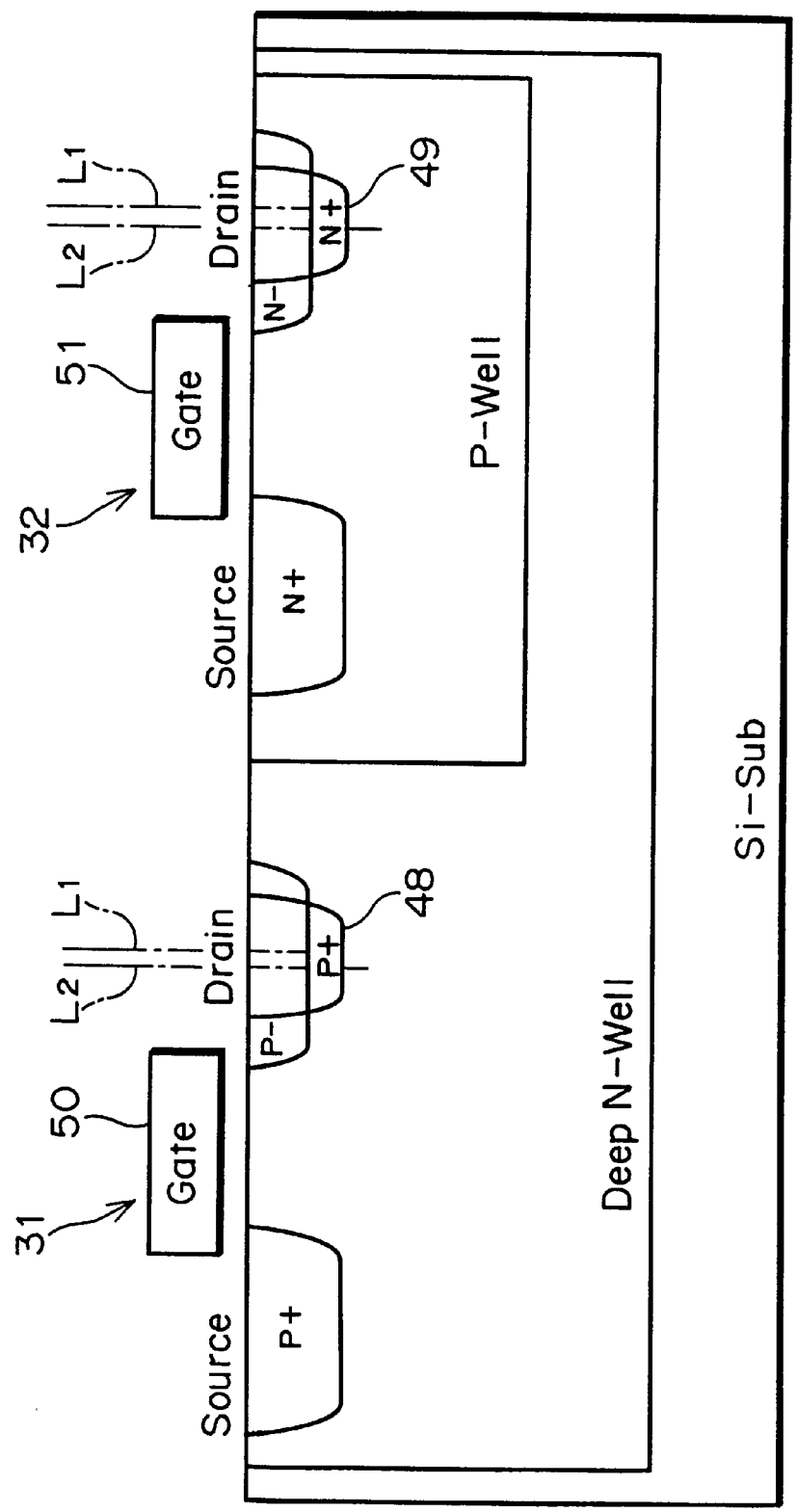
FIG. 18 is a cross section of the CMOS in the source circuit according to the present invention.

The tenth embodiment of the present invention is explained in reference to FIG. 18. With the word line drive circuits in the eighth and ninth embodiments of the present invention, the difference between the potentials at the gate electrode and the source side source can be reduced to a desired level. However, this means that the difference between the potentials at the drain side (the connection point of the PMOS 31 and the NMOS 32) and the gate electrode is increased.

For instance, in the eighth embodiment shown in FIG. 17, during the application of voltage to the selected word line WL in a write operation, the PMOS 31 must withstand the total potential difference of 1 V, i.e., the difference between 3V applied to the gate and −8V applied to the drain.

In addition, during the voltage application to the selected word line WL in a delete operation, the NMOS 32 must withstand the total potential difference of 15V, i.e., the difference between −5V applied to the gate and 10V applied to the drain. Moreover, if this potential difference is to be applied to the gate oxide film, the gate oxide film cannot be made thinner due to considerations of reliability.

Gn order to eliminate these concerns, the areas of high impurity content 48 and 49 toward the drains of the NMOS 32 and the PMOS 31 in the CMOS (31 and 32) may be offset so that they are further away from the gate electrodes 50 and 51 of the two MOS transistors 32 and 31 than the central lines L2 of the drains.

By offsetting the areas of high impurity content 48 and 49 in this manner, a structure in which the electrical field is absorbed by the n-layer and the p-layer of each drain is achieved and with this, it becomes possible to attenuate the electric field imparted to the gate oxide film.

By adjusting the width of this offset, even when a potential difference close to, for instance, 20V is applied between the gate and the drain, the potential difference applied to the gate oxide film can be adjusted to a desired small value, thereby making it possible to reduce the film thickness of the gate oxide film.

While the source circuit according to the present invention has been explained in applications as a word line drive circuit, the source circuit according to the present invention is not limited to word line drive circuits and it may be adopted, for instance, to constitute various types of source circuits in a semiconductor memory such as a bit line drive circuit or a block selection line drive circuit. Since it is capable of handling the required voltage separately from the voltage applied to the gate oxide film, it makes it possible to provide a nonvolatile semiconductor memory in which a thinner gate oxide film is used in a peripheral Tr.

As has been explained, in the semiconductor nonvolatile memory according to the present invention, since, only the sub bit lines and the sub source line for the memory cells in a selected group are respectively connected to the bit lines and the source line through the operation of the sub bit line selection transistors and the block selection transistor which interlock with the sub bit line selection transistors during a data write, any electrical effect imparted by the bit line and the source line on the sub bit lines and sub source line in the remaining unselected groups can be cutoff.

Furthermore, by causing the two selection transistors, i.e., the sub bit line selection transistors and the block selection transistor to operate by interlocking with each other, a separate control circuit for controlling the operation of the block selection transistor can be dispensed with.

En addition, by connecting only the sub source line in a selected group to the source line and cutting off the sub source line in unselected groups from the source line during a data write through the operation of the block selection transistor, even if a positive potential is applied to unselected word lines within the selected group in order to reduce the potential difference from the potential at the sub bit line during a data write, any effect on the other groups imparted by the current flowing to the source line and also by the increase in the potential of the source line can be minimized.

Thus, according to the present invention, the sub bit line disturbance can be prevented without inducing any new disturbance-related problems.

In addition, as has been explained, with the source device according to the present invention, the PMOS can be set in a state of electrical continuity without having to apply a negative potential at the NMOS side which demonstrates a large difference from the source potential of the PMOS to the gate of the PMOS, and also the NMOS can be set in a state of electrical continuity without having to apply the positive potential at the PMOS side which demonstrates a large difference from the source potential of the NMOS to the gate of the NMOS.

Consequently, according to the present invention, since the individual gate voltages can be set lower than those in the prior art, the film thickness of the gate oxide film can be reduced in correspondence to this reduction in the gate voltages.

The semiconductor nonvolatile memory and source circuit for this memory according to the invention has been discussed so far by way of preferred embodiments with reference to the accompanying drawings. It should be noted, however, that the present invention is not be limited to these preferred embodiments just shown as examples. It is apparent for persons skilled in the art of this field to device a variety of changes and modifications within the scope of the technical thought as recited in the claims for patent attached hereto. Accordingly, it should be understood that these changes and modifications naturally fall in the technical scope of the invention.

The entire disclosure of Japanese Patent Application No. 9-1134385 filed on May 8 1997 including specification, claims, drawings and summary is incorporated herein by reference in its entirety.

What is claimed is:

1. A NOR type semiconductor nonvolatile memory in which a data overwrite employing an FN tunnel current is possible, comprising:
   a plurality of memory cells each having a control gate and a floating gate connected to a word line, a source connected to a source line and a drain connected to a bit line;
   sub bit lines mutually connected in parallel with said drains of said memory cells connected with a plurality of word lines for grouping said memory cells in units of a plurality of word lines;
   sub bit line selection transistors that connect said sub bit lines to said bit line interruptably;
   a sub source line connected to said source of said memory cells in a block grouped by said bit lines; and
   a block selection transistor that connects said sub source line to said source line interruptably, wherein:
      prior to a write of data into one or more memory cells, said sub bit line selection transistors and said block selection transistor corresponding to a group interlock with each other in order to connect only said sub bit lines and said sub source line corresponding to a selected group to said bit line and said source line respectively.

2. A NOR type semiconductor nonvolatile memory according to claim 1, wherein:
   during write of data into said memory cells, said sub bit line selection transistors and said block selection transistor corresponding to a selected block are set in a state of electrical continuity, with a voltage corresponding to said data applied to said sub bit lines within said selected block, a negative voltage applied to said word line that has been selected within said block, a positive voltage applied to said word lines that have not been selected within said block, and said sub bit line selection transistors and said block selection transistor corresponding to remaining unselected blocks are set in a cutoff state.

3. A NOR type semiconductor nonvolatile memory according to claim 1, wherein:
   during a delete of data from said memory cells, said sub bit line selection transistor and said block selection transistor corresponding to a selected block are set in a state of electrical continuity, with a negative voltage applied to said sub bit lines within said selected block, a positive voltage applied to said word line that has been selected within said block and a negative voltage applied to said word lines that have not been selected within said block.

4. A NOR type semiconductor nonvolatile memory, comprising:
   a plurality of memory cells each having a control gate and a floating gate connected to a word line, a source connected to a source line and a drain connected to a bit line incorporated in a semiconductor substrate;
   a bipolar voltage circuit mounted in said semiconductor substrate in order to perform overwrite of data by employing an FN tunnel current, with which overwrite is possible;
   sub bit line selection transistors that connect said sub bit lines to said bit line interruptably;
   a sub source line connected to said source of said memory cells in a block grouped by said bit lines; and
   a block selection transistor that connects said sub source line to said source line interruptably, wherein:
      prior to a write of data into one or more memory cells, said sub bit line selection transistors and said block selection transistor corresponding to a group interlock with each other; and
      said bipolar voltage circuit comprises:
         a CMOS constituted by mutually connecting in series a source or a drain of an NMOS which is formed in a first substrate portion and is provided with a gate, and a source or a drain of a PMOS which is formed in a second substrate portion having a different conduction type from said first substrate portion and is provided with a gate, with a positive potential and a negative potential applied to two ends thereof at said PMOS side and at said NMOS side and an output potential extracted from a connection portion of said two MOS transistors;
         a first means for voltage application that selectively applies said potential applied at said PMOS side and a first intermediate potential that is lower than said potential applied at said PMOS side and higher than said potential applied at said NMOS side to said gate of said PMOS; and
         a second means for voltage application that selectively applies said potential applied at said NMOS side and a second intermediate potential higher than said potential applied at said NMOS side and lower than said potential applied at said PMOS side to said gate of said NMOS.

* * * * *